(12) United States Patent
Hatano et al.

(10) Patent No.: US 8,901,012 B2
(45) Date of Patent: Dec. 2, 2014

(54) SEMICONDUCTOR MANUFACTURING APPARATUS AND METHOD FOR MANUFACTURING SEMICONDUCTOR DEVICE

(75) Inventors: Masayuki Hatano, Kanagawa-ken (JP); Hiroshi Tokue, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 13/599,358

(22) Filed: Aug. 30, 2012

(65) Prior Publication Data
US 2013/0224963 A1 Aug. 29, 2013

(30) Foreign Application Priority Data
Feb. 27, 2012 (JP) .................................. 2012-040209

(51) Int. Cl.
*C23C 16/52* (2006.01)
*H01L 21/67* (2006.01)
*C23C 16/44* (2006.01)

(52) U.S. Cl.
CPC ............. *C23C 16/55* (2013.01); *C23C 16/4401* (2013.01); *H01L 21/6715* (2013.01)
USPC ........... 438/758; 118/663; 118/712; 118/715; 118/58; 118/641; 700/121; 264/496

(58) Field of Classification Search
CPC .... H01L 21/6715; C23C 16/52; C23C 16/04; C23C 16/042; C23C 16/047; C23C 16/4401
USPC ......... 118/213, 301, 504, 505, 720, 721, 712, 118/663, 715, 58, 641; 700/121; 438/758; 427/259, 282; 156/345.15, 345.17, 156/345.19, 345.21, 345.24, 345.3; 264/496

See application file for complete search history.

(56) References Cited

U.S. PATENT DOCUMENTS

| | | | | |
|---|---|---|---|---|
| 5,814,267 A * | 9/1998 | Sakai et al. | .................... | 264/496 |
| 6,077,350 A * | 6/2000 | Morton et al. | .................. | 118/58 |
| 6,542,830 B1 * | 4/2003 | Mizuno et al. | .................. | 702/35 |
| 6,613,588 B2 * | 9/2003 | Nakano et al. | .................... | 438/9 |
| 6,712,928 B2 * | 3/2004 | Nakano et al. | ........... | 156/345.24 |
| 6,722,798 B2 * | 4/2004 | Senba et al. | .................. | 396/611 |
| 6,949,147 B2 * | 9/2005 | Uziel et al. | ........................ | 134/1 |

(Continued)

FOREIGN PATENT DOCUMENTS

| | | |
|---|---|---|
| JP | 06-104157 | 4/1994 |
| JP | 07-167631 | 7/1995 |

(Continued)

*Primary Examiner* — Jeffrie R Lund
(74) *Attorney, Agent, or Firm* — Finnegan, Henderson, Farabow, Garrett & Dunner, L.L.P.

(57) ABSTRACT

According to one embodiment, a semiconductor manufacturing apparatus includes a substrate stage, a transfer unit, and a control unit. A substrate is settable on the substrate stage. The transfer unit is configured to transfer a pattern having an uneven configuration onto a major surface of the substrate by attachably and removably holding a template. The pattern is provided in the transfer surface. The control unit is configured to acquire information relating to a number of foreign objects on the major surface prior to the transferring of the pattern. The control unit adds the number for a plurality of the substrates including the pattern transferred by the transfer unit. The control unit causes the transfer unit not to implement the transferring of the pattern in the case where the sum has reached the upper limit.

20 Claims, 5 Drawing Sheets

(56) References Cited

U.S. PATENT DOCUMENTS

| | | | |
|---|---|---|---|
| 7,338,275 B2* | 3/2008 | Choi et al. | 425/385 |
| 7,854,974 B2* | 12/2010 | Zehavi et al. | 428/34.1 |
| 7,952,701 B2* | 5/2011 | Matsui | 356/237.3 |
| 8,468,480 B2* | 6/2013 | Inanami et al. | 716/110 |
| 8,550,801 B2* | 10/2013 | Furutono et al. | 425/139 |
| 8,691,123 B2* | 4/2014 | Nakagawa et al. | 264/40.4 |
| 2003/0149506 A1* | 8/2003 | Haanstra et al. | 700/121 |
| 2004/0262290 A1* | 12/2004 | Haanstra et al. | 219/490 |
| 2005/0118338 A1* | 6/2005 | Stebe et al. | 427/331 |
| 2006/0116784 A1* | 6/2006 | Chiu et al. | 700/110 |
| 2006/0189138 A1* | 8/2006 | Nishimura et al. | 438/692 |
| 2007/0018362 A1* | 1/2007 | Heidari et al. | 264/496 |
| 2008/0047930 A1* | 2/2008 | Blanchet et al. | 216/41 |
| 2008/0241969 A1* | 10/2008 | Winkler et al. | 438/5 |
| 2008/0243294 A1* | 10/2008 | Winkler et al. | 700/121 |
| 2008/0243295 A1* | 10/2008 | Winkler et al. | 700/121 |
| 2008/0248205 A1* | 10/2008 | Blanchet et al. | 427/282 |
| 2009/0213364 A1* | 8/2009 | Matsui | 356/237.3 |
| 2010/0190340 A1* | 7/2010 | Lee et al. | 438/694 |
| 2010/0230048 A1* | 9/2010 | Colburn et al. | 156/345.3 |
| 2010/0237540 A1* | 9/2010 | Inanami et al. | 264/293 |
| 2011/0182805 A1* | 7/2011 | DeSimone et al. | 424/1.11 |
| 2011/0192300 A1* | 8/2011 | Hatano et al. | 101/340 |
| 2012/0061882 A1* | 3/2012 | Furutono et al. | 264/496 |
| 2012/0074605 A1* | 3/2012 | Nakagawa et al. | 264/40.1 |
| 2012/0244719 A1* | 9/2012 | Hatano et al. | 438/759 |
| 2012/0288636 A1* | 11/2012 | Tokue | 427/510 |
| 2013/0217155 A1* | 8/2013 | Fukuhara et al. | 438/14 |
| 2013/0224963 A1* | 8/2013 | Hatano et al. | 438/758 |

FOREIGN PATENT DOCUMENTS

| | | | |
|---|---|---|---|
| JP | 07190942 A * | 7/1995 | G01N 21/88 |
| JP | 2005-051046 | 2/2005 | |
| JP | 2005-136345 | 5/2005 | |
| JP | 2011-017914 | 1/2011 | |

* cited by examiner

SEMICONDUCTOR MANUFACTURING APPARATUS AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2012-040209, filed on Feb. 27, 2012; the entire contents of which are incorporated herein by reference.

FIELD

Embodiments described herein relate generally to a semiconductor manufacturing apparatus and a method for manufacturing semiconductor device.

BACKGROUND

In a semiconductor manufacturing apparatus that manufactures semiconductor devices using nanoimprint technology, there are cases where foreign objects on a semiconductor substrate clog the unevenness pattern of a template. The foreign objects clogging the template reduce the precision of the pattern that is formed. Therefore, cleaning of the template is performed every constant number of times the processing is performed. However, the foreign objects appear irregularly. In the case where the cleaning is performed every constant number of times the processing is performed, there are cases where a template that is still usable is unnecessarily cleaned. Unnecessary cleaning reduces the processing efficiency of the semiconductor manufacturing apparatus. Conversely, in the case where the foreign objects occur at a high frequency, there are cases where the use of the template is undesirably continued in a state in which the precision of the pattern is low.

DETAILED DESCRIPTION

Figure 1:
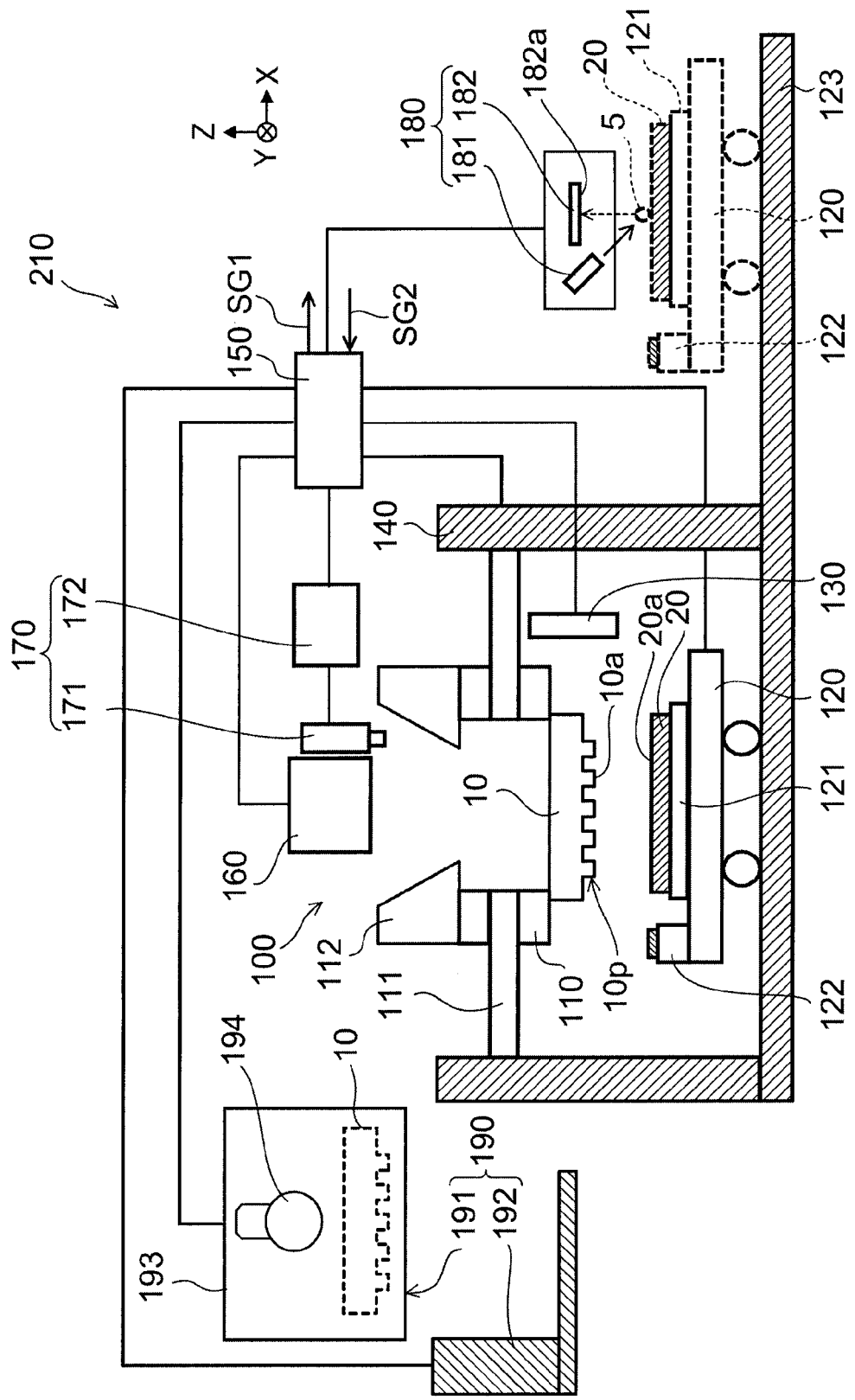
FIG. 1 is a schematic view illustrating the configuration of a semiconductor manufacturing apparatus according to a first embodiment.

According to one embodiment, a semiconductor manufacturing apparatus includes a substrate stage, a transfer unit, and a control unit. A substrate is settable on the substrate stage. The substrate includes a semiconductor. The transfer unit is configured to transfer a pattern having an uneven configuration onto a major surface of the substrate by attachably and removably holding a template, causing a transfer surface of the template to contact the major surface of the substrate, and curing a transfer material coated onto the major surface. The pattern is provided in the transfer surface. The control unit is configured to acquire information relating to a number of foreign objects on the major surface of the substrate prior to the transferring of the pattern and add the number of the foreign objects for a plurality of the substrates including the pattern transferred by the transfer unit. The control unit causes the transfer unit to implement the transferring of the pattern in the case where a sum of the number of the foreign objects is less than an upper limit. The control unit causes the transfer unit not to implement the transferring of the pattern in the case where the sum has reached the upper limit.

Various embodiments will be described hereinafter with reference to the accompanying drawings.

The drawings are schematic or conceptual; and the relationships between the thicknesses and the widths of portions, the proportions of sizes between portions, etc., are not necessarily the same as the actual values thereof. The dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic view illustrating the configuration of a semiconductor manufacturing apparatus according to a first embodiment.

As illustrated in FIG. 1, the semiconductor manufacturing apparatus 210 includes a substrate stage 120 on which a substrate 20 including a semiconductor is set, a transfer unit 100 that transfers a pattern onto a major surface 20a of the substrate 20, and a control unit 150 that is electrically connected to each of the units of the semiconductor manufacturing apparatus 210 to control the operations of the units of the semiconductor manufacturing apparatus 210. The semiconductor manufacturing apparatus 210 performs so-called nanoimprinting of the substrate 20. For example, the semiconductor manufacturing apparatus 210 is used to manufacture semiconductor devices such as transistors, memory, etc. For example, the semiconductor devices may be MEMS (Micro Electro Mechanical Systems) in which semiconductor parts are combined with mechanical parts.

For example, the substrate 20 includes silicon. For example, a hard mask layer is provided on the silicon of the substrate 20. For example, the major surface 20a is formed of the hard mask layer. The hard mask layer may include, for example, $SiO_2$. For example, the substrate 20 is set in the semiconductor manufacturing apparatus 210 in a state in which multiple substrates 20 are contained in a not-illustrated cassette.

For example, the transfer unit 100 includes: a template holding unit 110 that attachably and removably holds a template 10, where a pattern 10p having an uneven configuration is provided in a transfer surface 10a of the template 10; a dropping unit 130 that coats a transfer material onto the major surface 20a of the substrate 20 set on the substrate stage 120 by dropping the transfer material onto the major surface 20a; a movement mechanism 140 that moves the template holding unit 110 between a first position where the transfer surface 10a of the template 10 is caused to contact the major surface 20a of the substrate 20 and a second position where the transfer surface 10a is caused to separate from the major surface 20a; a light irradiation unit 160 to cure the transfer material; and a measuring unit 170 that measures the diameters of liquid droplets formed on the major surface 20a.

The template holding unit 110 holds the template 10 such that the transfer surface 10a opposes the major surface 20a of the substrate 20. The transfer material may include, for example, a photocurable resin and the like. For example, the light irradiation unit 160 irradiates light (a first light) toward the major surface 20a to cause the curing of the transfer material including the photocurable resin to progress. For example, the light irradiation unit 160 irradiates ultraviolet light of not less than 300 nm and not more than 400 nm toward the major surface 20a. The light emitted from the light irradiation unit 160 passes through the template 10 and is incident on the major surface 20a. Therefore, the template 10 includes an optically transmissive material. The template 10 may include, for example, quartz and the like. Thereby, the transfer material is cured by the light emitted from the light irradiation unit 160. For example, the transfer material may be a thermosetting resin that is cured by the application of heat. In such a case, the transfer material may be cured using a heater, etc., instead of the light irradiation unit 160.

For example, the transfer unit 100 causes the template holding unit 110 to hold the template 10. For example, the transfer unit 100 coats the transfer material onto the major surface 20a using the dropping unit 130. For example, the transfer unit 100 drives the movement mechanism 140 to cause the transfer surface 10a to contact the major surface 20a on which the transfer material is coated. For example, the transfer unit 100 causes the transfer material to cure using the light irradiation unit 160 in the state in which the transfer surface 10a is caused to contact the major surface 20a. For example, the transfer unit 100 again drives the movement mechanism 140 to cause the transfer surface 10a to separate from the major surface 20a. Thereby, the transfer unit 100 transfers the pattern 10p of the template 10 onto the major surface 20a of the substrate 20.

The dropping unit 130, the light irradiation unit 160, and the measuring unit 170 are provided if necessary and may be omitted. For example, the dropping unit 130, the light irradiation unit 160, and the measuring unit 170 may be provided separately from the semiconductor manufacturing apparatus 210.

Herein, a direction from the major surface 20a of the substrate 20 set on the substrate stage 120 toward the transfer surface 10a of the template 10 held by the template holding unit 110 is taken as a Z-axis direction. The positive direction of the Z axis is the upward direction; and the negative direction is the downward direction. One direction perpendicular to the Z-axis direction is taken as an X-axis direction. A direction perpendicular to the Z-axis direction and the X-axis direction is taken as a Y-axis direction.

The substrate stage 120 is provided on a stage planar table 123 and can move, for example, along the X-axis direction. The substrate stage 120 includes a substrate vacuum-attachment unit 121 and a reference mark table 122. The substrate vacuum-attachment unit 121 attachably and removably holds the substrate 20 by causing the substrate 20 to be held by a vacuum. The substrate 20 is set on the substrate stage 120 by being held by the vacuum to the substrate vacuum-attachment unit 121. For example, the reference mark table 122 is used to control the position of the substrate stage 120.

For example, the substrate stage 120 moves in the X-axis direction between a position where the substrate 20 extracted from the cassette by a not-illustrated transfer mechanism, etc., is received and a position where the major surface 20a of the substrate 20 is caused to oppose the transfer surface 10a of the template 10. Thereby, the substrate 20 that was contained in the cassette is in a state in which the substrate 20 opposes the template 10.

For example, after the substrate 20 is extracted from the cassette and the pattern 10p is transferred onto the substrate 20, the semiconductor manufacturing apparatus 210 returns the substrate 20 that has been processed to the cassette. Then, by sequentially extracting the next substrate 20 and repeating the same processing, the processing of the pattern transfer is performed continuously for each of the multiple substrates 20 contained in the cassette. Thus, the semiconductor manufacturing apparatus 210 processes the multiple substrates 20 continuously for, for example, each cassette.

For example, the dropping unit 130 is disposed along the transfer path of the substrate stage 120 between the cassette and the template holding unit 110. For example, the dropping unit 130 drops the transfer material onto the major surface 20a of the substrate 20 when the substrate stage 120 is moved along the X-axis direction and the substrate 20 is disposed below the dropping unit 130. The dropping unit 130 may include, for example, a liquid droplet dropper apparatus that uses an inkjet method and the like in which a piezoelectric element, etc., is used.

The template holding unit 110 is linked to a base 111. The base 111 is linked to the movement mechanism 140. For example, the movement mechanism 140 moves the template holding unit 110 in the Z-axis direction. For example, the movement mechanism 140 causes the transfer surface 10a to contact the major surface 20a by changing the distance between the transfer surface 10a of the template 10 and the major surface 20a of the substrate 20. It is sufficient for the movement mechanism 140 to be able to modify the relative positions of the transfer surface 10a of the template 10 and the major surface 20a of the substrate 20. For example, the movement mechanism 140 may have a configuration that moves the substrate stage 120 along the Z-axis direction.

For example, an alignment sensor 112 is provided in the base 111. For example, the alignment sensor 112 adjusts the positions of the template holding unit 110 and the substrate stage 120 in the X-Y plane. Thereby, the positions of the template 10 and the substrate 20 in the X-Y plane are appropriately controlled.

The measuring unit 170 includes an imaging unit 171 that images the liquid droplets provided on the substrate 20, and an image processing unit 172 that processes the image that is imaged by the imaging unit 171. For example, the measuring unit 170 measures the diameters of the liquid droplets formed on the major surface 20a of the substrate 20. For example, the measuring unit 170 may be used to recognize the alignment mark for the alignment between the template 10 and the substrate 20. The imaging unit 171 may include, for example, a CCD camera, etc.

The semiconductor manufacturing apparatus 210 further includes a foreign object detection unit 180 that detects foreign objects 5 on the major surface 20a prior to the transferring of the pattern 10p, and a cleaner 190 that performs a cleaning of the template 10. The foreign object detection unit 180 and the cleaner 190 may be provided if necessary and may be omitted. For example, the foreign object detection unit 180 and the cleaner 190 may be provided separately from the semiconductor manufacturing apparatus 210.

For example, the foreign object detection unit 180 includes a light emitting unit 181 and a light receiving unit 182. The light emitting unit 181 causes light (a second light) to be obliquely incident on the major surface 20a. The light receiving unit 182 includes a light reception surface 182a opposing the major surface 20a. For example, the light reception surface 182a is formed of multiple photodiodes disposed in a two-dimensional matrix configuration. For example, the light receiving unit 182 has a photoelectric conversion mechanism at the light reception surface 182a. For example, the foreign object detection unit 180 is disposed along the transfer path of the substrate stage 120 between the cassette and the template holding unit 110. In this example, the foreign object detection unit 180 is disposed, for example, along the transfer path between the cassette and the dropping unit 130.

In the case where there are no foreign objects 5 on the major surface 20a, the light emitted from the light emitting unit 181 is regularly reflected by the major surface 20a which is smooth. Therefore, in the case where there are no foreign objects 5 on the major surface 20a, the light emitted from the light emitting unit 181 is not incident on the light receiving unit 182. On the other hand, in the case where there are foreign objects 5 on the major surface 20a, the light emitted from the light emitting unit 181 undergoes diffused reflections at the foreign objects 5. Therefore, in the case where there are foreign objects 5 on the major surface 20a, a portion of the light emitted from the light emitting unit 181 is incident on the light reception surface 182a of the light receiving unit 182 as scattered light.

For example, the foreign object detection unit 180 detects the foreign objects 5 by whether or not the light emitted from the light emitting unit 181 is received by the light receiving unit 182. For example, the foreign object detection unit 180 detects that there are foreign objects 5 on the major surface 20a in the case where the light is emitted from the light emitting unit 181 and the light receiving unit 182 receives the light. In the semiconductor manufacturing apparatus 210, for example, the foreign object detection unit 180 is caused to perform the detection while changing the relative positions of the major surface 20a and the foreign object detection unit 180 by moving the substrate stage 120. Thereby, the detection of the foreign objects 5 is performed for the entire major surface 20a. For example, the foreign objects 5 detected by the foreign object detection unit 180 include particles of $SiO_2$ occurring in the manufacturing processes of the semiconductor device, metal dust (e.g., stainless steel and aluminum) from the semiconductor manufacturing apparatus 210, etc.

For example, the foreign object detection unit 180 detects the positions of the foreign objects 5 on the major surface 20a based on the positions of the light incident on the light receiving unit 182 at the light reception surface 182a and the relative positions of the major surface 20a and the foreign object detection unit 180. Also, for example, the foreign object detection unit 180 detects the sizes of the foreign objects 5 from the surface area of the light received by the light receiving unit 182. For example, the foreign object detection unit 180 detects particles having a maximum width not less than 0.1 μm as the foreign objects 5.

After the foreign object detection unit 180 performs the detection of the foreign objects 5 for one substrate 20, for example, the foreign object detection unit 180 supplies information relating to the number of the foreign objects 5 that are detected and the positions and the sizes of each of the foreign objects 5 that are detected to the control unit 150 as the foreign object information detected for the foreign objects 5 on the major surface 20a prior to the transferring of the pattern 10p.

The foreign object detection unit 180 is not limited to the configuration recited above and may have, for example, a configuration that images the major surface 20a prior to the transferring of the pattern 10p and detects the foreign objects 5 by image processing. For example, the foreign object information may be the electrical signal of the light receiving unit 182 when the foreign objects 5 of the entire major surface 20a are detected. In such a case, the control unit 150 may determine the number and/or the sizes of the foreign objects 5 based on the electrical signal.

For example, the cleaner 190 includes a cleaning unit 191 and a transfer arm 192. For example, the cleaning unit 191 includes a housing 193 that contains the template 10, and a light source 194 that irradiates the ultraviolet toward the template 10 contained in the housing 193. For example, the light source 194 irradiates vacuum ultraviolet (VUV). For example, the light source 194 irradiates light of a wavelength not less than 10 nm and not more than 200 nm as the vacuum ultraviolet. The cleaning unit 191 cleans the template 10 by irradiating the vacuum ultraviolet onto the template 10 to decompose and perform oxidation-volatilization removal of organic substances adhered to the template 10. At this time, to suppress the absorption of the vacuum ultraviolet by oxygen, the state of the cleaning unit 191 inside the housing 193 is, for example, a vacuum state, or the interior of the housing 193 is filled with nitrogen. For example, the cleaning of the template 10 may be ultrasonic cleaning, etc.

The transfer arm 192 transfers the template 10 between the template holding unit 110 and the cleaning unit 191. For example, in the case where the cleaning of the template 10 is performed, the transfer arm 192 receives the template 10 that is removed from the template holding unit 110 and transfers the template 10 to the cleaning unit 191. For example, the transfer arm 192 transfers the template 10 that is cleaned by the cleaning unit 191 from the cleaning unit 191 to the template holding unit 110; and the template holding unit 110 is caused to hold the template 10 again.

For example, the control unit 150 is electrically connected to the transfer unit 100, the substrate stage 120, the foreign object detection unit 180, and the cleaner 190 to control the operations of the transfer unit 100, the substrate stage 120, the foreign object detection unit 180, and the cleaner 190.

The control unit 150 acquires the foreign object information from the foreign object detection unit 180 for each of the substrates 20 to be processed. When the control unit 150 acquires the foreign object information, the control unit 150 cumulatively adds the number of the foreign objects 5 based on the foreign object information and stores the cumulative value (the sum). The reference for the cumulative adding of the foreign objects 5 is the point in time when the template 10 is replaced with a new template 10 or the point in time when the cleaning of the template 10 is performed; and the cumulative value is counted from this point in time. In the control unit 150, the acquisition of the foreign object information is not limited to being performed for all of the substrates 20 to be processed and may be performed, for example, every few substrates 20.

For example, the control unit 150 sets the cumulative value to be "0" when a template 10 that has not been used is held by the template holding unit 110. Each time the processing of the pattern transfer onto the substrate 20 is performed, the control unit 150 acquires the foreign object information from the foreign object detection unit 180 and adds the number of the foreign objects 5 included in the foreign object information.

For example, in the case where two foreign objects 5 are detected on the first substrate 20 to be processed after a template 10 that has not been used is held by the template holding unit 110, the control unit 150 sets the cumulative value to be "2." Then, in the case where, for example, one foreign object 5 is detected on the next substrate 20 that is to be processed, the control unit 150 cumulatively adds "1" to "2" and sets the cumulative value to be "3."

For example, the control unit 150 clears the cumulative value in the case where the template 10 is replaced with a new template 10 and in the case where the template 10 is cleaned by the cleaner 190. The information to determine whether or not to replace the template 10 or whether or not to clean the template 10 may be information that is internally generated by the control unit 150 or information that is supplied from outside the control unit 150.

The upper limit of the cumulative value of the number of the foreign objects 5 is stored in the control unit 150. For example, the upper limit of the cumulative value is 60 particles (e.g., not less than 50 particles and not more than 100 particles). The control unit 150 determines whether or not the cumulative value of the number of the foreign objects 5 has reached the upper limit after performing the cumulative adding of the number of the foreign objects 5. In the case where the control unit 150 determines that the cumulative value has not reached the upper limit, the control unit 150 causes the transfer unit 100 to execute the processing of the transfer of the pattern 10p. On the other hand, in the case where the control unit 150 determines that the cumulative value has reached the upper limit, the control unit 150 causes the transfer unit 100 to stop the processing of the transfer of the pattern 10p. Thus, the control unit 150 causes the transfer unit 100 to implement the transferring of the pattern 10p in the case where the cumulative value of the number of the foreign objects 5 is less than the upper limit; and the control unit 150 causes the transfer unit 100 not to implement the transferring of the pattern 10p in the case where the cumulative value has reached the upper limit.

In the case where the control unit 150 stops the processing of the transfer of the pattern 10p by the transfer unit 100, the control unit 150 instructs the cleaner 190 to execute a cleaning. After causing the cleaner 190 to clean the template 10, the control unit 150 releases the stop of the transfer unit 100 and causes the processing of the transfer to restart. Also, the control unit 150 clears the cumulative value of the number of the foreign objects 5 when releasing the stop of the transfer unit 100.

When the control unit 150 acquires the foreign object information, the control unit 150 determines whether or not the sizes of the foreign objects 5 that are detected are not less than a prescribed value based on the foreign object information. For example, the control unit 150 performs the determination of the maximum width included in the foreign objects 5 using 1.0 µm as the prescribed value. In the case where even one of the foreign objects 5 having a size of 1.0 µm or greater is included in the substrate 20, the control unit 150 stops the processing of this substrate 20. On the other hand, in the case where the sizes of all of the foreign objects 5 included in the substrate 20 are less than 1.0 µm, the control unit 150 causes the processing of this substrate 20 to continue. For example, the substrate 20 for which the processing is stopped is returned to the cassette without the pattern 10p being transferred. Then, for example, the substrate 20 for which the processing is stopped is sent to a process in which the foundation such as the hard mask layer, etc., is reprocessed.

Thus, in this example, the transfer of the pattern 10p onto the substrate 20 is executed normally in the case where, for example, the sizes of the foreign objects 5 included in the substrate 20 are less than 1.0 µm and the cumulative value of the number of the foreign objects 5 is less than 60 particles. In the case where the sizes of the foreign objects 5 included in the substrate 20 are less than 1.0 µm and the cumulative value of the number of the foreign objects 5 is not less than 60 particles, the transfer of the pattern 10p onto the substrate 20 is executed after the cleaning of the template 10 is performed by the cleaner 190. In the case where the sizes of the foreign objects 5 included in the substrate 20 are not less than 1.0 µm, the transfer of the pattern 10p onto the substrate 20 is stopped; and the processing of the next substrate 20 is started.

Figure 2:
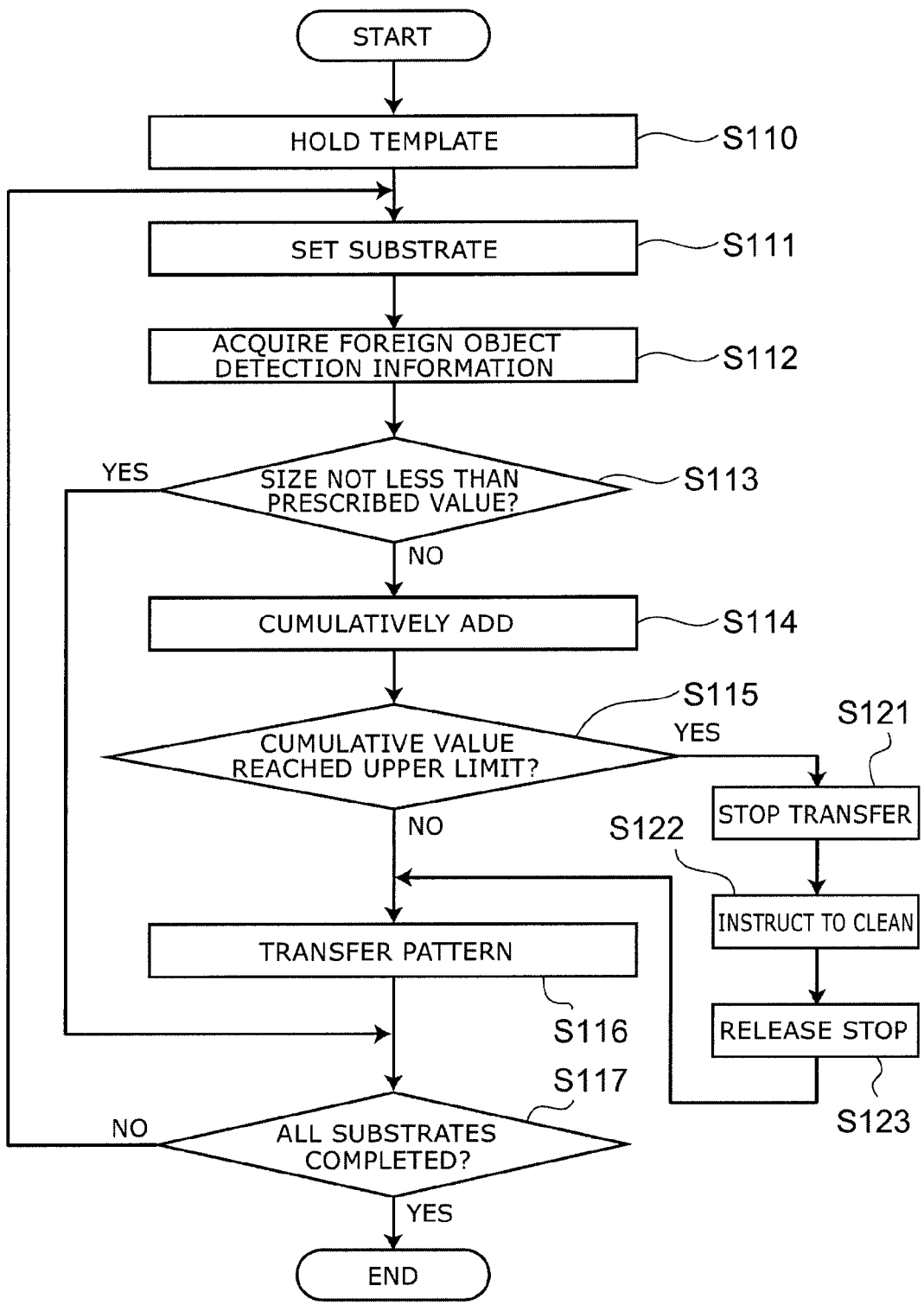
FIG. 2 is a flowchart illustrating a method for manufacturing a semiconductor device of the semiconductor manufacturing apparatus according to the first embodiment.

FIG. 2 is a flowchart illustrating a method for manufacturing a semiconductor device of the semiconductor manufacturing apparatus according to the first embodiment.

As illustrated in FIG. 2, in the case where the semiconductor device is manufactured by the semiconductor manufacturing apparatus 210, first, the template holding unit 110 is caused to hold the template 10 (step S110). A cassette that contains the multiple substrates 20 is set in the semiconductor manufacturing apparatus 210. The control unit 150 is instructed to start the processing.

When the control unit 150 is instructed to start the processing, the control unit 150 drives the substrate stage 120 to move the substrate stage 120 to the position where the substrate 20 is received. The control unit 150 sets the substrate 20 on the substrate stage 120 by causing the substrate 20 extracted from the cassette to be held by a vacuum to the substrate vacuum-attachment unit 121 (step S111).

The control unit 150 moves the substrate stage 120 in the X-axis direction to cause the major surface 20a of the substrate 20 to oppose the foreign object detection unit 180. The control unit 150 acquires the foreign object information relating to the substrate 20 to be processed from the foreign object detection unit 180 by instructing the foreign object detection unit 180 to execute the detection in the state in which the major surface 20a of the substrate 20 opposes the foreign object detection unit 180 (step S112).

The control unit 150 determines whether or not the sizes of the foreign objects 5 that are detected are not less than the prescribed value based on the foreign object information that is acquired (step S113). For example, it is determined whether or not the sizes of the foreign objects 5 that are detected are not less than 1.0 µm. In the case where even one of the foreign objects 5 included in the substrate 20 has a size of 1.0 µm or greater, the control unit 150 stops the processing of this substrate 20. In the case where the processing is stopped, the control unit 150 starts the processing of the next substrate 20 without performing the transferring of the pattern 10p onto this substrate 20. Thereby, when performing the nanoimprinting, undesirable damage of the template 10 and the substrate 20 due to an excessively large foreign object 5 being interposed between the transfer surface 10a and the major surface 20a can be suppressed.

In the case where the sizes of all of the foreign objects 5 included in the substrate 20 are less than 1.0 µm, the control unit 150 causes the processing of this substrate 20 to continue. In the case where the processing is caused to continue, the control unit 150 cumulatively adds the number of the foreign objects 5 based on the foreign object information and stores the cumulative value (step S114).

After performing the cumulative adding of the number of the foreign objects 5, the control unit 150 determines whether or not the cumulative value of the number of the foreign objects 5 has reached the upper limit (step S115). For example, it is determined whether or not the cumulative value of the number of the foreign objects 5 has reached 60 particles.

In the case where the control unit 150 determines that the cumulative value has not reached the upper limit, the control unit 150 causes the transfer unit 100 to execute the processing of the transfer of the pattern 10p onto this substrate 20 (step S116). In other words, in the case where the cumulative value is less than the upper limit, the control unit 150 causes the transfer unit 100 to implement the transfer of the pattern 10p.

In the processing of the transfer of the pattern 10p by the transfer unit 100, the substrate stage 120 is moved in the X-axis direction; and the major surface 20a of the substrate 20 is caused to oppose the dropping unit 130. The transfer material is coated onto the major surface 20a by the dropping unit 130. The substrate stage 120 is moved in the X-axis direction; and the major surface 20a of the substrate 20 is caused to oppose the transfer surface 10a of the template 10. The movement mechanism 140 is driven; and the transfer surface 10a is caused to contact the major surface 20a on which the transfer material is coated (the template holding unit 110 moves to the first position from the second position). The transfer material is caused to cure by the light being irradiated from the light irradiation unit 160 toward the major surface 20a in the state in which the transfer surface 10a is caused to contact the major surface 20a. The movement mechanism 140 is driven; and the transfer surface 10a is caused to separate from the major surface 20a (the template holding unit 110 moves to the second position from the first position). Thereby, the pattern 10p of the template 10 is transferred onto the major surface 20a of the substrate 20.

In the case where the control unit 150 determines that the cumulative value has reached the upper limit in step S115, the control unit 150 stops the processing of the transfer of the pattern 10p by the transfer unit 100 (step S121). In other words, in the case where the cumulative value has reached the upper limit, the control unit 150 causes the transfer unit 100 not to implement the transferring of the pattern 10p. After stopping the processing of the transfer of the transfer unit 100, the control unit 150 instructs the cleaner 190 to execute a cleaning (step S122). When instructed to execute the cleaning, the cleaner 190 cleans the template 10 that was held by the template holding unit 110 and subsequently returns the template 10 to the template holding unit 110.

After causing the cleaner 190 to clean the template 10, the control unit 150 releases the stop of the transfer unit 100 (step S123). Also, the control unit 150 clears the cumulative value of the number of the foreign objects 5 when releasing the stop of the transfer unit 100. The control unit 150 releases the stop of the transfer unit 100 and causes the transfer unit 100 to execute the processing of the transfer of the pattern 10p onto the substrate 20 (step S116).

In the case where the processing of the nanoimprinting is performed in the state in which there are foreign objects 5 on the major surface 20a, there are cases where the foreign objects 5 clog the pattern 10p and defects undesirably occur in the pattern 10p. In the semiconductor manufacturing apparatus 210, unnecessary cleaning of the template 10 can be suppressed because the foreign objects 5 on the major surface 20a prior to the transferring of the pattern 10p are detected and the cleaning of the template 10 is performed based on the cumulative value of the foreign objects 5. Accordingly, in the semiconductor manufacturing apparatus 210, the nanoimprinting can be performed efficiently. Because the cleaning of the template 10 is performed based on the cumulative value of the foreign objects 5 in the semiconductor manufacturing apparatus 210, the undesirable continuous use of the template 10 in a state in which the precision of the pattern 10p is low also can be suppressed. Accordingly, in the semiconductor manufacturing apparatus 210, the nanoimprinting can be performed with high precision.

In the case where the control unit 150 causes the execution of the processing of the transfer of the pattern 10p and in the case where the control unit 150 determines the sizes of the foreign objects 5 that are detected to be not less than the prescribed value, the control unit 150 determines whether or not the processing has ended for all of the substrates 20 included in the cassette. In the case where the processing has not ended, the next substrate 20 is set onto the substrate stage 120; and the processing recited above is repeated. In the case where the processing has ended, the processing is stopped.

Thus, in the semiconductor manufacturing apparatus 210, the nanoimprinting can be performed with high efficiency and high precision.

For example, the foreign object information may be acquired from a foreign object detection unit provided outside the semiconductor manufacturing apparatus 210 or may be acquired from another apparatus. The instruction to execute the cleaning in step S122 may be not only an instruction to the cleaner 190 provided in the interior of the semiconductor manufacturing apparatus 210 but may be an instruction to a cleaner separate from the semiconductor manufacturing apparatus 210. For example, a configuration may be used in which the processing up to stopping the transfer of the pattern 10p by the transfer unit 100 is performed and the stop of the transfer unit 100 is released according to an input of a second signal SG2 for the stop release. In other words, the control unit 150 may release the state in which the transferring of the pattern 10p is not implemented when the second signal SG2 to release the state in which the transferring of the pattern 10p is not implemented is input to the control unit 150. For example, a configuration may be used in which the second signal SG2 is input from a separate apparatus. Or, a configuration may be used in which a stop release button (a stop release operation unit) is provided in the semiconductor manufacturing apparatus 210 and the second signal SG2 is input to the control unit 150 according to the operation of the stop release button.

Figure 3:
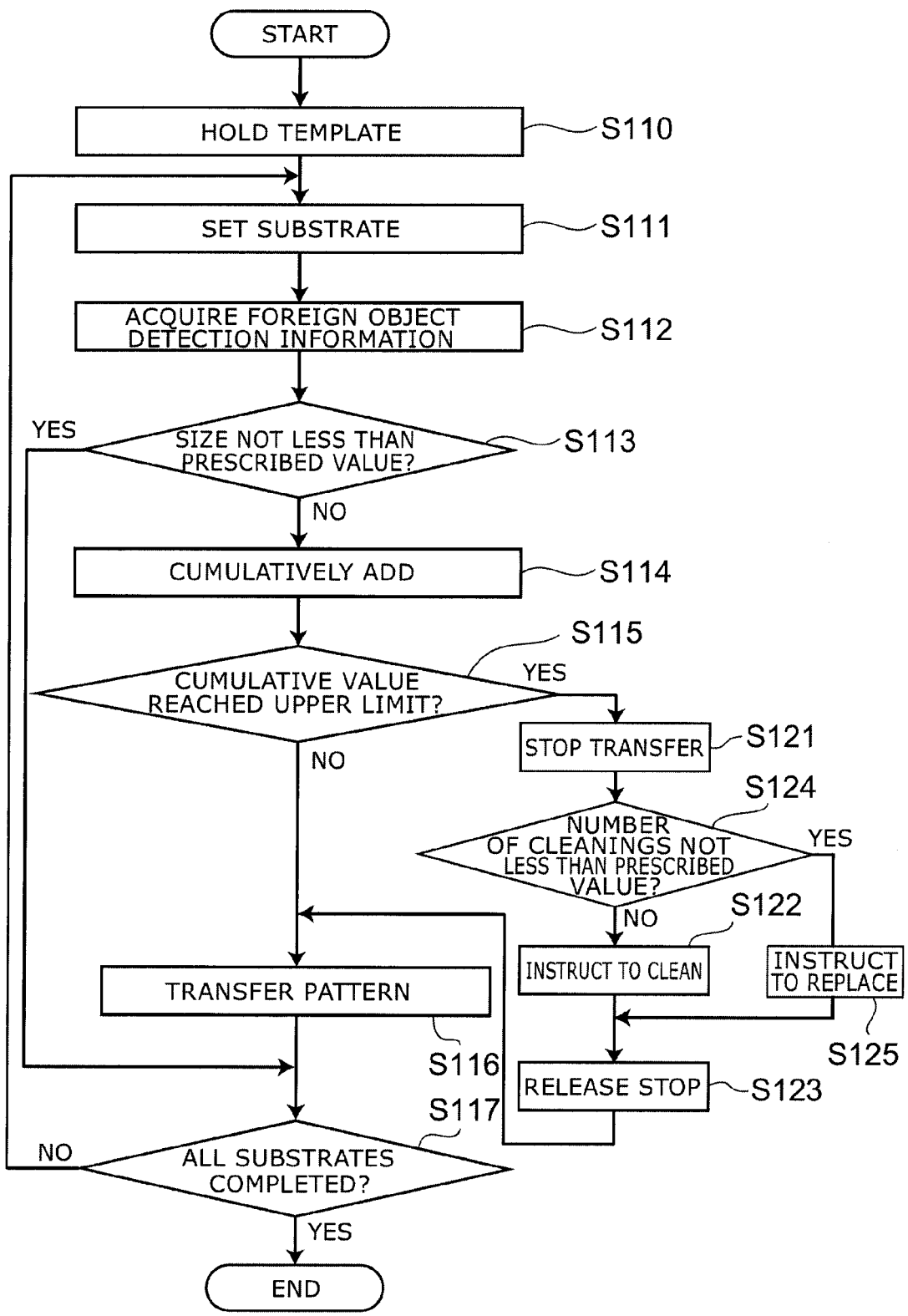
FIG. 3 is a flowchart illustrating another method for manufacturing a semiconductor device of the semiconductor manufacturing apparatus according to the first embodiment.

FIG. 3 is a flowchart illustrating another method for manufacturing a semiconductor device of the semiconductor manufacturing apparatus according to the first embodiment.

As illustrated in FIG. 3, after the determination of having reached the upper limit in step S115 and the processing of the transfer of the pattern 10p by the transfer unit 100 being stopped in step S121, it may be determined whether or not the number of cleanings of the template 10 that is being used is not less than a prescribed value (step S124).

In the case where the template 10 is used repeatedly, for example, the foreign objects 5 that cannot be removed by the cleaning may clog the pattern 10p; and a portion of the pattern 10p may be damaged by contact with the foreign objects 5, etc. Therefore, for example, the number of times the template 10 that is being used has been cleaned by the cleaner 190 is stored in the control unit 150. Then, the determination of step 124 is performed by the control unit 150. In the case where the number of cleanings of the template 10 that is being used is less than the prescribed value, the control unit 150 proceeds to step S122 and instructs the cleaner 190 to execute a cleaning. On the other hand, in the case where the number of cleanings of the template 10 that is being used is not less than the prescribed value, the control unit 150 outputs, for example, a first signal SG1 to the transfer unit 100 to replace the template 10 (step S125). For example, the transfer unit 100 responds to the input of the first signal SG1 by replacing the template 10 using a not-illustrated arm, etc. The replacement of the template 10 may be performed manually. In other words, the instruction to replace the template 10 may be a notification to the user, etc.

After the replacement of the template 10 ends, the control unit 100 proceeds to step S123, clears the cumulative value of the number of the foreign objects 5, and releases the stop of the transfer unit 100. Thus, if the template 10 is replaced according to the number of cleanings of the template 10 that is being used, the nanoimprinting can be performed with higher precision. In the processes of the manufacturing method illustrated in FIG. 2, step S122 may be replaced with the instruction to replace the template 10. In other words, the template 10 may be replaced each time the cumulative value of the number of the foreign objects 5 reaches the upper limit.

Second Embodiment

Figure 4:
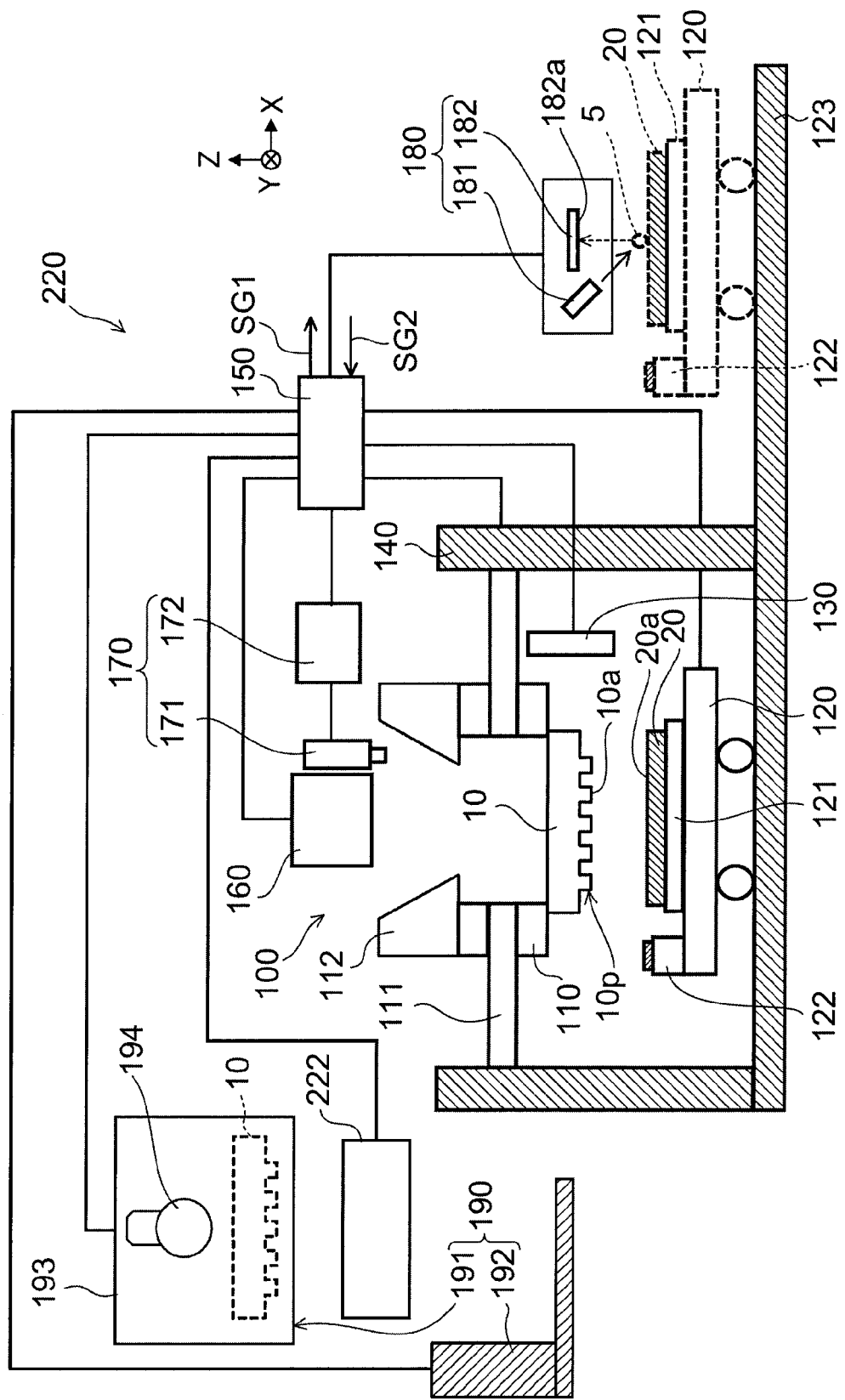
FIG. 4 is a schematic view illustrating the configuration of a semiconductor manufacturing apparatus according to a second embodiment.

FIG. 4 is a schematic view illustrating the configuration of a semiconductor manufacturing apparatus according to a second embodiment.

As illustrated in FIG. 4, the semiconductor manufacturing apparatus 220 further includes a template inspection unit 222. For example, the template inspection unit 222 is disposed along the transfer path of the transfer arm 192 and performs an inspection of the pattern 10p of the template 10 after the cleaning. For example, the template inspection unit 222 inspects the defects of the pattern 10p by imaging the transfer surface 10a of the template 10 and performing image processing of the imaged data.

For example, the template inspection unit 222 uses the image processing to acquire the number of the defects of the pattern 10p of the template 10 after the cleaning. For example, the template inspection unit 222 is electrically connected to the control unit 150. For example, after performing the inspection of the pattern 10p, the template inspection unit 222 supplies the information including the number of the defects that is acquired to the control unit 150 as pattern inspection information that indicates the inspection result of the pattern 10p. Here, the defects of the pattern 10p are, for example, the foreign objects 5 clogging the pattern 10p, etc. For example, the maximum width of the defects of the pattern 10p is not less than 0.1 μm and not more than 1.0 μm.

For example, after causing the cleaner 190 to perform the cleaning, the control unit 150 causes the template inspection unit 222 to execute the inspection of the pattern 10p and acquires the pattern inspection information from the template inspection unit 222. After acquiring the pattern inspection information, the control unit 150 renews the upper limit used in the determination of the cumulative value of the number of the foreign objects 5. For example, the control unit 150 renews the upper limit using the following Formula (1), where UL1 is the upper limit which is the basis (the upper limit prior to the renewing), UL2 is the upper limit after the renewing, and a is the number of the defects of the pattern 10p included in the pattern inspection information.

$$UL2 = UL1 - \alpha \quad (1)$$

In other words, the control unit 150 determines the upper limit UL2 after the renewing to be the upper limit UL1 which is the basis minus the number α of the defects of the pattern 10p that could not be removed by the cleaning.

Figure 5:
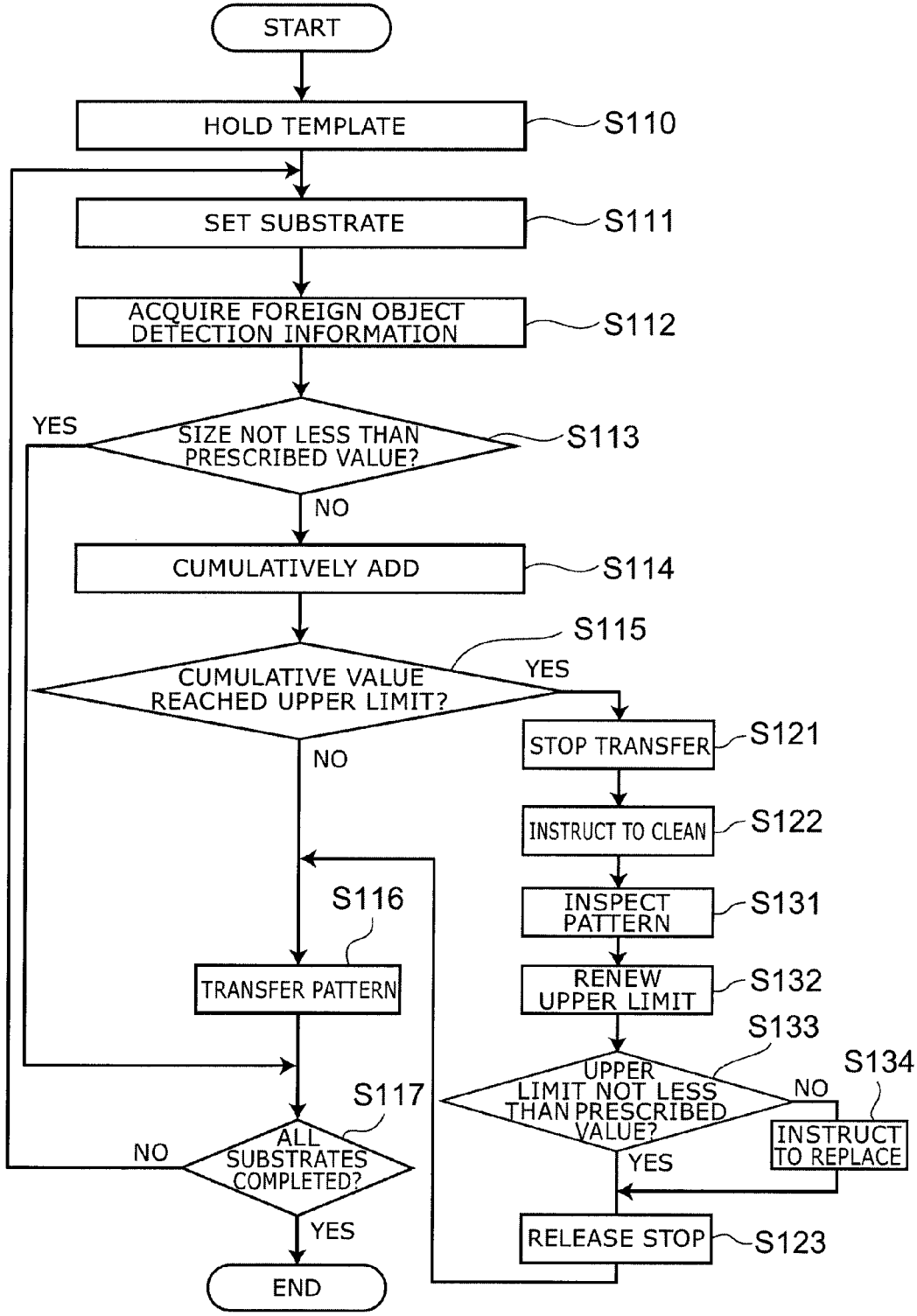
FIG. 5 is a flowchart illustrating a method for manufacturing a semiconductor device of the semiconductor manufacturing apparatus according to the second embodiment.

FIG. 5 is a flowchart illustrating a method for manufacturing a semiconductor device of the semiconductor manufacturing apparatus according to the second embodiment.

As illustrated in FIG. 5, the control unit 150 of the semiconductor manufacturing apparatus 220 determines that the upper limit has been reached in step S115, stops the processing of the transfer of the pattern 10p by the transfer unit 100 in step S121, instructs the cleaner 190 to execute the cleaning in step S122, and subsequently instructs the template inspection unit 222 to execute the inspection of the pattern 10p (step S131). Then, the control unit 150 acquires the pattern inspection information from the template inspection unit 222.

Based on the pattern inspection information that is acquired, the control unit 150 renews the upper limit using Formula (1) (step S132). The control unit 150 determines whether or not the renewed upper limit is not less than the prescribed value (step S133). In the case where the renewed upper limit is not less than the prescribed value, the control unit 150 proceeds to step S123 and releases the stop of the transfer unit 100. On the other hand, in the case where the renewed upper limit is not more than the prescribed value, the control unit 150 outputs the first signal SG1 to replace the template 10 (step S134). After the replacement of the template 10 is performed, the control unit 150 proceeds to step S123 and releases the stop of the transfer unit 100.

Thus, in the semiconductor manufacturing apparatus 220, the pattern 10p is inspected after the cleaning; and the upper limit is renewed according to the number of the defects that could not be removed by the cleaning. Thus, the undesirable continued use of the template 10 in the state in which the precision of the pattern 10p is low can be suppressed more appropriately. Accordingly, in the semiconductor manufacturing apparatus 220, the nanoimprinting can be performed with higher precision. Further, the timing of the replacement of the template 10 can be ascertained more appropriately by determining whether or not the renewed upper limit is not less than the prescribed value. The template inspection unit 222 may be provided separately from the semiconductor manufacturing apparatus 220. The control unit 150 may acquire the pattern inspection information from the template inspection unit 222 that is provided separately from the semiconductor manufacturing apparatus 220.

According to the embodiments, a semiconductor manufacturing apparatus and a method for manufacturing a semiconductor device that can perform nanoimprinting with high efficiency and high precision are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor manufacturing apparatuses such as substrate stages, transfer units, control units, cleaners, foreign object detection units, light sources, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all semiconductor manufacturing apparatuses and methods for manufacturing semiconductor devices practicable by an appropriate design modification by one skilled in the art based on the substrate holding apparatuses, the pattern transfer apparatuses, and the pattern transfer methods described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor manufacturing apparatus, comprising:
    a substrate stage, a substrate being settable on the substrate stage, the substrate including a semiconductor;
    a transfer unit configured to transfer a pattern having an uneven configuration onto a major surface of the substrate by attachably and removably holding a template, causing a transfer surface of the template to contact the major surface of the substrate, and curing a transfer material coated onto the major surface, the pattern being provided in the transfer surface; and
    a control unit configured to acquire information relating to a number of foreign objects on the major surface of the substrate prior to the transferring of the pattern and add the number of the foreign objects for a plurality of the substrates including the pattern transferred by the transfer unit, the control unit being configured to cause the transfer unit to implement the transferring of the pattern in the case where a sum of the number of the foreign objects is less than an upper limit, the control unit being configured to cause the transfer unit not to implement the transferring of the pattern in the case where the sum has reached the upper limit.

2. The apparatus according to claim 1, wherein the transfer unit includes:
    a template holding unit configured to attachably and removably hold the template; and
    a movement mechanism configured to move the template holding unit between a first position where the transfer surface of the template is caused to contact the major surface of the substrate and a second position where the transfer surface is caused to separate from the major surface.

3. The apparatus according to claim 2, wherein:
    the transfer material includes a photocurable resin; and
    the transfer unit further includes a light irradiation unit configured to irradiate a first light toward the major surface, curing of the transfer material being caused to progress by the first light.

4. The apparatus according to claim 3, wherein:
    the template is optically transmissive; and
    the light irradiation unit is configured to cause the first light to be incident on the major surface by causing the first light to pass through the template.

5. The apparatus according to claim 3, wherein the transfer unit further includes a dropping unit configured to coat the transfer material onto the major surface of the substrate set on the substrate stage by dropping the transfer material onto the major surface.

6. The apparatus according to claim 1, wherein the control unit acquires the information relating to the number of the foreign objects and performs the adding for each of the substrates to be processed.

7. The apparatus according to claim 1, wherein the control unit instructs a cleaner to execute a cleaning in the case where the sum has reached the upper limit, the cleaner being configured to perform a cleaning of the template.

8. The apparatus according to claim 7, wherein the cleaner includes a light source configured to irradiate ultraviolet toward the template.

9. The apparatus according to claim 7, wherein the control unit clears the sum and causes the transfer unit to implement the transferring of the pattern after causing the cleaner to clean the template.

10. The apparatus according to claim 7, wherein the control unit stores a number of the cleanings of the template by the cleaner and outputs a first signal to replace the template in the case where the sum reaches the upper limit and the number of the cleanings is not less than a prescribed value.

11. The apparatus according to claim 7, wherein the control unit clears the sum and causes the transfer unit to implement the transferring of the pattern after replacing the template.

12. The apparatus according to claim 1, further comprising a foreign object detection unit configured to supply the information relating to the number of the foreign objects to the control unit by detecting the foreign objects on the major surface.

13. The apparatus according to claim 12, wherein the foreign object detection unit includes:
    a light emitting unit configured to cause a second light to be obliquely incident on the major surface; and
    a light receiving unit configured to receive the second light reflected by the foreign objects, the light receiving unit having a light reception surface opposing the major surface.

14. The apparatus according to claim 1, wherein the control unit acquires information relating to a size of the foreign objects, and causes the transfer unit not to implement the transferring of the pattern in the case where the size of the foreign objects is not less than a prescribed value.

15. The apparatus according to claim 14, wherein the control unit determines the size of the foreign objects to be not less than the prescribed value in the case where the size of the foreign objects is not less than 1.0 μm.

16. The apparatus according to claim 1, wherein the control unit further acquires information relating to a number α of defects of the template and renews the upper limit based on the number α of the defects.

17. The apparatus according to claim 16, wherein the control unit outputs a first signal to replace the template in the case where the upper limit after the renewing is not less than a prescribed value.

18. The apparatus according to claim 16, further comprising a template inspection unit configured to image the transfer surface and inspect the defects of the pattern by performing image processing of the imaged data.

19. The apparatus according to claim 1, wherein the control unit releases the state in which the transfer unit is caused not to implement the transferring of the pattern when a second signal is input, the second signal being a signal to release the state in which the transferring of the pattern is caused not to be implemented.

20. A method for manufacturing a semiconductor device, comprising:
    setting a substrate on a substrate stage, the substrate including a semiconductor;
    acquiring information relating to a number of foreign objects on a major surface of the substrate prior to transferring a pattern;
    adding the number of the foreign objects for a plurality of the substrates including the transferred pattern; and
    determining whether or not a sum of the number of the foreign objects has reached an upper limit, and implementing processing to transfer the pattern onto the major surface by causing a transfer surface of a template to contact the major surface of the substrate and curing a transfer material coated onto the major surface of the substrate in the case where the sum is less than the upper limit and not implementing the processing to transfer the pattern in the case where the sum has reached the upper limit, the pattern having an uneven configuration and being provided in the transfer surface of the template.

* * * * *